(12) United States Patent
Nakagawa et al.

(10) Patent No.: US 11,764,880 B2
(45) Date of Patent: Sep. 19, 2023

(54) ACOUSTIC WAVE DEVICE, MULTIPLEXER, HIGH-FREQUENCY FRONT END CIRCUIT, AND COMMUNICATION DEVICE

(71) Applicant: Murata Manufacturing Co., Ltd., Nagaokakyo (JP)

(72) Inventors: Ryo Nakagawa, Nagaokakyo (JP); Katsuya Daimon, Nagaokakyo (JP); Hideki Iwamoto, Nagaokakyo (JP); Tsutomu Takai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 435 days.

(21) Appl. No.: 16/914,521

(22) Filed: Jun. 29, 2020

(65) Prior Publication Data

US 2020/0328822 A1    Oct. 15, 2020

Related U.S. Application Data

(63) Continuation of application No. PCT/JP2018/046698, filed on Dec. 19, 2018.

(30) Foreign Application Priority Data

Jan. 12, 2018  (JP) .................................. 2018-003867

(51) Int. Cl.
*H04B 11/00* (2006.01)
*H03F 3/19* (2006.01)
(Continued)

(52) U.S. Cl.
CPC .............. *H04B 11/00* (2013.01); *H03F 3/19* (2013.01); *H03H 9/145* (2013.01); *H03H 9/25* (2013.01);
(Continued)

(58) Field of Classification Search
CPC ..... H04B 11/00; H03F 3/19; H03F 2200/451; H03F 2200/111; H03F 2203/7209;
(Continued)

(56) References Cited

U.S. PATENT DOCUMENTS 5,760,663 A * 6/1998 Pradal ...................... H03H 3/04
                                                               333/187
2010/0007435 A1    1/2010 Kawamoto et al.
(Continued)

FOREIGN PATENT DOCUMENTS

JP    2010-021718 A    1/2010
JP    2011-071911 A    4/2011
(Continued)

OTHER PUBLICATIONS

Official Communication issued in corresponding Japanese Patent Application No. 2019-564598, dated Apr. 13, 2021.
(Continued)

*Primary Examiner* — Eugene Yun
(74) *Attorney, Agent, or Firm* — KEATING & BENNETT, LLP

(57) ABSTRACT

An acoustic wave device is provided between a first terminal that is an antenna terminal and a second terminal that is different from the first terminal, and includes a plurality of acoustic wave resonators. The plurality of acoustic wave resonators include a plurality of series arm resonators and a plurality of parallel arm resonators. When the acoustic wave resonator electrically closest to the first terminal among the plurality of acoustic wave resonators is an antenna end resonator, the antenna end resonator is a SAW resonator or a BAW resonator. At least one acoustic wave resonator other than the antenna end resonator among the plurality of acoustic wave resonators is a first acoustic wave resonator.

18 Claims, 8 Drawing Sheets

(51) Int. Cl.
  *H03H 9/145* (2006.01)
  *H03H 9/25* (2006.01)
  *H03H 9/64* (2006.01)
  *H03H 9/72* (2006.01)
(52) U.S. Cl.
  CPC ............ *H03H 9/6483* (2013.01); *H03H 9/72* (2013.01); *H03F 2200/451* (2013.01)
(58) Field of Classification Search
  CPC ... H03F 1/56; H03F 3/245; H03F 3/72; H03F 3/195; H03H 9/145; H03H 9/25; H03H 9/6483; H03H 9/72; H03H 9/02574; H03H 9/02866; H03H 9/605
  See application file for complete search history.

(56) References Cited

U.S. PATENT DOCUMENTS

| | | |
|---|---|---|
| 2013/0127565 A1 | 5/2013 | Nishihara et al. |
| 2013/0285768 A1 | 10/2013 | Watanabe et al. |
| 2013/0321102 A1 | 12/2013 | Iwaki |
| 2017/0244431 A1 | 8/2017 | Araki |
| 2018/0138893 A1* | 5/2018 | Caron ..................... H04L 25/00 |
| 2019/0123709 A1* | 4/2019 | Inoue ................... H03H 9/0222 |
| 2019/0123720 A1 | 4/2019 | Takamine |
| 2020/0021274 A1* | 1/2020 | Wagner .................. H03H 9/545 |

FOREIGN PATENT DOCUMENTS

| | | |
|---|---|---|
| JP | 2013-110655 A | 6/2013 |
| JP | 2013-251848 A | 12/2013 |
| JP | 2017-152881 A | 8/2017 |
| WO | 2012/086639 A1 | 6/2012 |
| WO | 2013/128636 A1 | 9/2013 |
| WO | 2018/003296 A1 | 1/2018 |

OTHER PUBLICATIONS

Official Communication issued in International Patent Application No. PCT/JP2018/046698, dated Feb. 26, 2019.

* cited by examiner

ACOUSTIC WAVE DEVICE, MULTIPLEXER, HIGH-FREQUENCY FRONT END CIRCUIT, AND COMMUNICATION DEVICE

CROSS REFERENCE TO RELATED APPLICATIONS

This application claims the benefit of priority to Japanese Patent Application No. 2018-003867 filed on Jan. 12, 2018 and is a Continuation Application of PCT Application No. PCT/JP2018/046698 filed on Dec. 19, 2018. The entire contents of each application are hereby incorporated herein by reference.

BACKGROUND OF THE INVENTION

1. Field of the Invention

The present invention generally relates to an acoustic wave device, a multiplexer, a high-frequency front end circuit, and a communication device, and more particularly, to an acoustic wave device, a multiplexer, a high-frequency front end circuit, and a communication device including a plurality of acoustic wave resonators.

2. Description of the Related Art

Hitherto, as an example of an acoustic wave resonator, there has been known an acoustic wave resonator formed by laminating a high acoustic velocity film, a low acoustic velocity film, a piezoelectric film, and an IDT electrode in this order on a support substrate (for example, refer to International Publication No. 2012/086639). The acoustic wave resonator described in International Publication No. 2012/086639 has a high efficiency of confining acoustic wave energy in a thickness direction of the support substrate, and thus has a high Q factor. Therefore, a filter with a small insertion loss can be configured.

The acoustic wave resonator described in International Publication No. 2012/086639 has a problem in that a large ripple due to the influence of a stopband edge (hereinafter referred to as stopband ripple) occurs on a higher frequency side than an anti-resonant frequency.

SUMMARY OF THE INVENTION

Preferred embodiments of the present invention provide acoustic wave devices, multiplexers, high-frequency front end circuits, and communication devices that are each able to reduce the stopband ripple on the higher frequency side than the anti-resonant frequency.

An acoustic wave device according to a preferred embodiment of the present invention is provided between a first terminal which is an antenna terminal and a second terminal which is different from the first terminal. The acoustic wave device includes a plurality of acoustic wave resonators. The plurality of acoustic wave resonators include a plurality of series arm resonators and a plurality of parallel arm resonators. The plurality of series arm resonators are provided on a first path electrically connecting the first terminal and the second terminal. The plurality of parallel arm resonators are provided on a plurality of second paths electrically connecting each of a plurality of nodes on the first path and the ground. When an acoustic wave resonator which is electrically closest to the first terminal among the plurality of acoustic wave resonators is an antenna end resonator, the antenna end resonator is a SAW resonator or a BAW resonator. At least one acoustic wave resonator other than the antenna end resonator among the plurality of acoustic wave resonators is a first acoustic wave resonator. The SAW resonator includes a piezoelectric substrate and an IDT electrode provided on the piezoelectric substrate and including a plurality of electrode fingers. The first acoustic wave resonator includes a piezoelectric layer, an IDT electrode, and a high acoustic velocity member. The IDT electrode is provided on the piezoelectric layer, and includes a plurality of electrode fingers. The high acoustic velocity member is located on a side opposite to the IDT electrode with the piezoelectric layer interposed between the high acoustic velocity layer and the IDT electrode. An acoustic velocity of a bulk wave propagating through the high acoustic velocity member is higher than an acoustic velocity of an acoustic wave propagating through the piezoelectric layer. A thickness of the piezoelectric layer is about $3.5\lambda$ or less when a wavelength of an acoustic wave determined by an electrode finger period of the IDT electrode is $\lambda$.

A multiplexer according to a preferred embodiment of the present invention includes a first filter including an acoustic wave device according to a preferred embodiment of the present invention and a second filter. The second filter is provided between the first terminal and a third terminal that is different from the first terminal. A pass band of the first filter is a lower frequency band than a pass band of the second filter.

A high-frequency front end circuit according to a preferred embodiment of the present invention includes a multiplexer according to a preferred embodiment of the present invention and an amplifier circuit electrically connected to the multiplexer.

A communication device according to a preferred embodiment of the present invention includes a high-frequency front end circuit according to a preferred embodiment of the present invention and a signal processing circuit. The signal processing circuit processes high-frequency signals transmitted and received by an antenna. The high-frequency front end circuit communicates the high-frequency signals between the antenna and the signal processing circuit.

According to preferred embodiments the present invention, the stopband ripple on the higher frequency side than the anti-resonant frequency is able to be reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
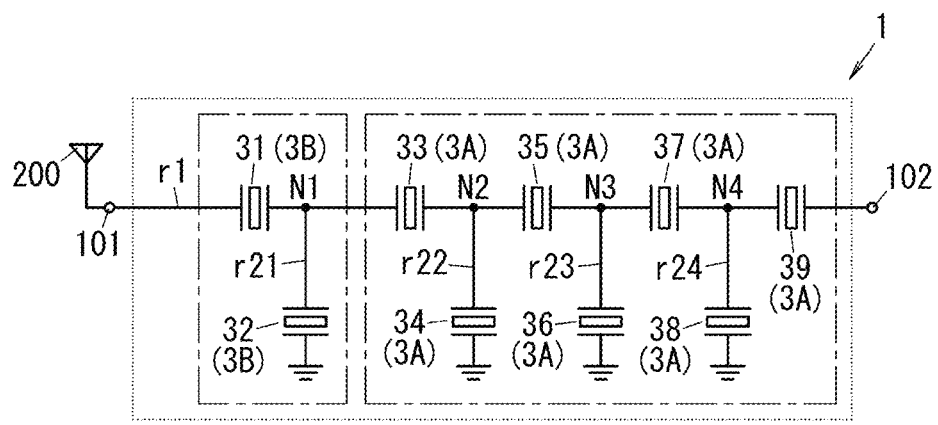
FIG. 1 is a circuit diagram of an acoustic wave device according to a preferred embodiment of the present invention.

Hereinafter, an acoustic wave device 1, a multiplexer 100, a high-frequency front end circuit 300, and a communication device 400 according to preferred embodiments of the present invention will be described with reference to the drawings.

FIGS. 2, 3A, 3B, 4A, 4B, 8A, 8B, 11A, and 11B, which will be referred to in a preferred embodiment of the present invention and the like described below are all schematic diagrams, and the ratio of the size and thickness of each component in the drawings does not necessarily reflect the actual dimensional ratio.

(1) Overall Configuration of Acoustic Wave Device

First, the acoustic wave device 1 according to the present preferred embodiment will be described with reference to FIG. 1.

The acoustic wave device 1 according to the present preferred embodiment is, for example, a ladder filter. In the present preferred embodiment, the acoustic wave device 1 is a first filter 11 (see FIG. 7), which will be described later. As shown in FIG. 1, the acoustic wave device 1 includes a plurality (nine in the shown example) of acoustic wave resonators 31 to 39. The plurality of acoustic wave resonators 31 to 39 include a plurality (five in the shown example) of series arm resonators 31, 33, 35, 37, and 39 and a plurality (four in the shown example) of parallel arm resonators 32, 34, 36, and 38. As shown in FIG. 1, the acoustic wave device 1 is provided between a first terminal 101 which is an antenna terminal electrically connected to an antenna 200 and a second terminal 102 which is different from the first terminal 101.

The plurality of series arm resonators 31, 33, 35, 37, and 39 are connected in series on a first path r1 connecting the first terminal 101 and the second terminal 102. Specifically, the plurality of series arm resonators 31, 33, 35, 37, and 39 are connected in series in this order from a first terminal 101 side so that the series arm resonator 31 is electrically closest to the first terminal 101 and the series arm resonator 39 is electrically closest to the second terminal 102. The first terminal 101 is a common terminal for the first filter 11, a second filter 12, a third filter 21, and a fourth filter 22 (see FIG. 7), which will be described later, and is electrically connected to the antenna 200. The second terminal 102 is an individual terminal for the first filter 11 among the first filter 11, the second filter 12, the third filter 21, and the fourth filter 22.

The plurality of parallel arm resonators 32, 34, 36, and are provided on a plurality (four in the shown example) of second paths r21, r22, r23, and r24 that connects each of the plurality (four in the shown example) of nodes N1, N2, N3, and N4 on the first path r1 and the ground. Specifically, one end of the parallel arm resonator 32 is connected to the node N1 which is a connection point between the series arm resonator 31 and the series arm resonator 33, and another end of the parallel arm resonator 32 is connected to the ground. One end of the parallel arm resonator 34 is connected to the node N2 which is a connection point between the series arm resonator 33 and the series arm resonator 35, and another end of the parallel arm resonator 34 is connected to the ground. One end of the parallel arm resonator 36 is connected to the node N3 which is a connection point between the series arm resonator 35 and the series arm resonator 37, and another end of the parallel arm resonator 36 is connected to the ground. One end of the parallel arm resonator 38 is connected to the node N4 which is a connection point between the series arm resonator 37 and the series arm resonator 39, and another end of the parallel arm resonator 38 is connected to the ground.

Note that each of the plurality of series arm resonators 31, 33, 35, 37, and 39 and the plurality of parallel arm resonators 32, 34, 36, and 38 may be defined by a plurality of resonators connected in series or in parallel. In addition, an inductive element or a capacitive element may be provided on at least one of the first path r1, and the second paths r21, r22, r23, and r24.

In the present preferred embodiment, as shown in FIG. 1, the series arm resonator 31 that is electrically closest to the first terminal 101 among the plurality of series arm resonators 31, 33, 35, 37, and 39 and the parallel arm resonator 32 that is electrically closest to the first terminal 101 among the plurality of parallel arm resonators 32, 34, 36, and 38 are integrated in one chip. In addition, the remaining series arm resonators 33, 35, 37, and 39 among the plurality of series arm resonators 31, 33, 35, 37, and 39 and the remaining parallel arm resonators 34, 36, and 38 among the plurality of parallel arm resonators 32, 34, 36, and 38 are integrated in another chip. That is, for example, the acoustic wave device 1 according to the present preferred embodiment includes two chips. Note that all the acoustic wave resonators 31 to 39 may be integrated in one chip. In addition, the parallel arm resonator 32 may be integrated in the other chip in which the series arm resonators 33, 35, 37, and 38 and the parallel arm resonators 34, 36, and 38 are integrated.

Here, in the acoustic wave device 1 according to the present preferred embodiment, the acoustic wave resonator (series arm resonator) 31 that is electrically closest to the first terminal 101 among the plurality of acoustic wave resonators 31 to 39 is an antenna end resonator (hereinafter, also referred to as "antenna end resonator 31"). In the acoustic wave device 1 according to the present preferred embodiment, the series arm resonator 31 that is the antenna end resonator and the parallel arm resonator 32 that is electrically closest to the first terminal 101 among the plurality of parallel arm resonators 32, 34, 36, and 38 are surface acoustic wave (SAW) resonators 3B. In addition, in the acoustic wave device 1 according to the present preferred embodiment, the remaining series arm resonators 33, 35, 37, and 39 and the remaining parallel arm resonators 34, 36, and 38 are first acoustic wave resonators (acoustic wave resonators including high acoustic velocity layers) 3A. As described above, by integrating the first acoustic wave resonators 3A and the SAW resonators 3B in the different chips, there is an advantage that the first filter 11 is able to be easily manufactured as compared with a case where the first acoustic wave resonators 3A and the SAW resonators 3B are integrated in one chip.

Figure 2:
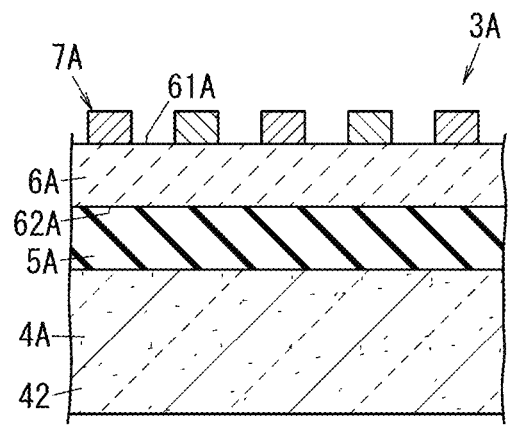
FIG. 2 is a sectional view of a first acoustic wave resonator in the acoustic wave device.

(2) Configuration of First Acoustic Wave Resonator and SAW Resonator (2.1) First Acoustic Wave Resonator First, the first acoustic wave resonator 3A will be described with reference to FIGS. 2, 3A, and 3B. The first acoustic wave resonator 3A is preferably, for example, a resonator having a three-layer structure. As shown in FIG. 2, the first acoustic wave resonator 3A includes a piezoelectric layer 6A, an interdigital transducer (IDT) electrode 7A, and a high acoustic velocity member 4A.

The IDT electrode 7A is provided on the piezoelectric layer 6A. The expression "provided on the piezoelectric layer 6A" as described herein includes a case directly provided on the piezoelectric layer 6A, and a case indirectly provided on the piezoelectric layer 6A. The high acoustic velocity member 4A is located on a side opposite to the IDT electrode 7A with the piezoelectric layer 6A provided between the high acoustic velocity layer 4A and the IDT electrode 7A. The piezoelectric layer 6A includes a first main surface 61A on an IDT electrode 7A side and a second main surface 62A on a high acoustic velocity member 4A side. In the high acoustic velocity member 4A, the acoustic velocity of a slowest bulk wave among the plurality of bulk waves propagating therethrough is higher than the acoustic velocity of an acoustic wave propagating through the piezoelectric layer 6A.

In addition, the first acoustic wave resonator 3A further includes a low acoustic velocity film 5A. The low acoustic velocity film 5A is provided between the high acoustic velocity member 4A and the piezoelectric layer 6A. In the low acoustic velocity film 5A, the acoustic velocity of a bulk wave propagating through the low acoustic velocity film 5A is lower than the acoustic velocity of a bulk wave propagating through the piezoelectric layer 6A. The high acoustic velocity member 4A is a high acoustic velocity support substrate 42. The high acoustic velocity support substrate 42 supports the low acoustic velocity film 5A, the piezoelectric layer 6A, and the IDT electrode 7A. In the high acoustic velocity support substrate 42, the acoustic velocity of the bulk wave propagating through the high acoustic velocity support substrate 42 is higher than the acoustic velocity of the acoustic wave propagating through the piezoelectric layer 6A. The first acoustic wave resonator 3A is a one-port acoustic wave resonator having a reflector (for example, a short circuit grating) on each side of the IDT electrode 7A in an acoustic wave propagation direction. However, the reflector is not necessarily required. The first acoustic wave resonator 3A is not limited to the one-port acoustic wave resonator, and may be, for example, a longitudinally coupled acoustic wave resonator.

(2.1.1) Piezoelectric Layer

The piezoelectric layer 6A p, for example, LiTaO$_3$, LiNbO$_3$, ZnO, AlN, or lead zirconate titanate (PZT). A thickness of the piezoelectric layer 6A is about 3.5λ or less when a wavelength of an acoustic wave determined by an electrode finger period of the IDT electrode 7A is λ. When the thickness of the piezoelectric layer 6A is about 3.5λ or less, a Q factor is high, but a stopband ripple occurs on a higher frequency side than an anti-resonant frequency.

(2.1.2) IDT Electrode

The IDT electrode 7A may preferably include an appropriate metal material, for example, Al, Cu, Pt, Au, Ag, Ti, Ni, Cr, Mo, W, or an alloy including any one of these metals as a main component. Further, the IDT electrode 7A may have a structure in which a plurality of metal films made of these metals or alloys is laminated. For example, the IDT electrode 7A is defined by an Al film, but is not limited thereto, and may be defined by a laminated film of an adhesive film made of a Ti film provided on the piezoelectric layer 6A and a main electrode film made of an Al film provided on the adhesive film, for example. A thickness of the adhesive film is preferably, for example, about 10 nm. In addition, a thickness of the main electrode film is preferably, for example, about 130 nm.

Figure 3A:
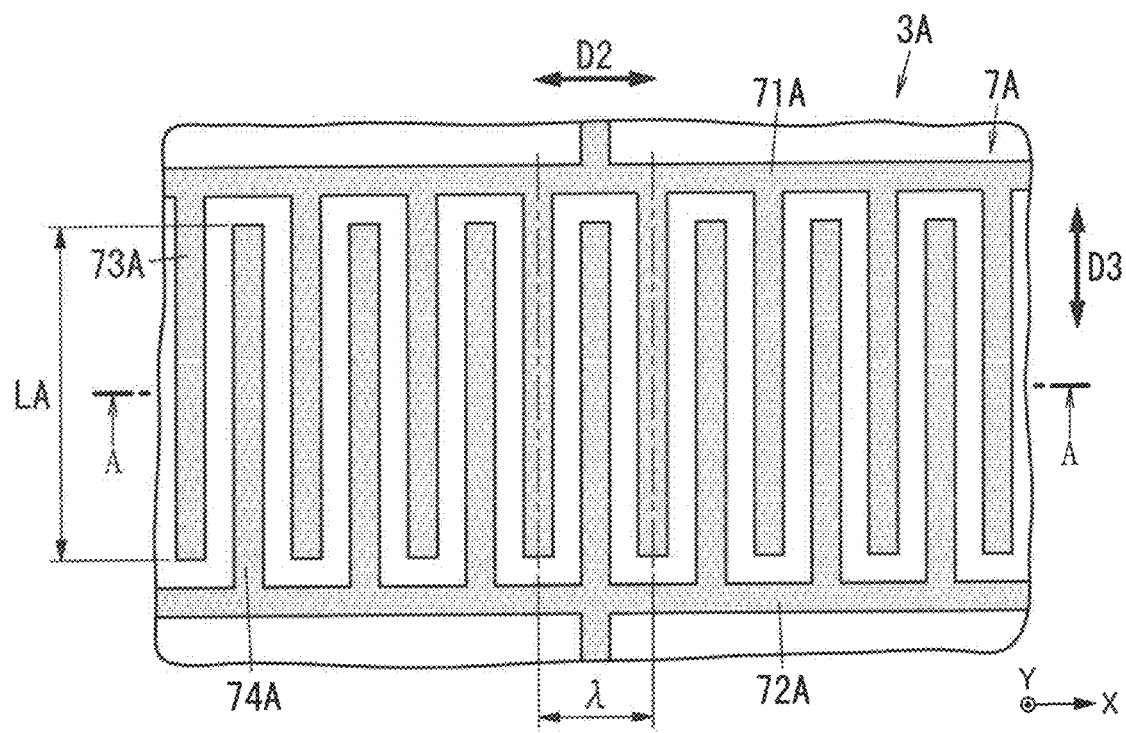
FIG. 3A is a plan view of a main portion of the first acoustic wave resonator in the acoustic wave device.
Figure 3B:
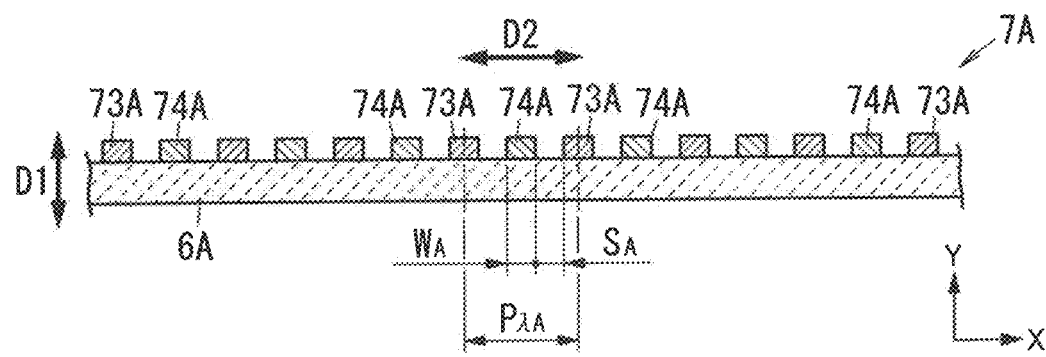
FIG. 3B is a sectional view taken along line A-A in FIG. 3A showing the first acoustic wave resonator in the acoustic wave device.

As shown in FIGS. 3A and 3B, the IDT electrode 7A includes a first busbar 71A, a second busbar 72A, a plurality of first electrode fingers 73A, and a plurality of second electrode fingers 74A. The high acoustic velocity member 4A and the low acoustic velocity film 5A shown in FIG. 2 are not shown in FIG. 3B.

The first busbar 71A and the second busbar 72A have an elongated shape whose longitudinal direction is a second direction D2 (X-axis direction) orthogonal or substantially orthogonal to a first direction D1 (Y direction) along a thickness direction of the high acoustic velocity member 4A. In the IDT electrode 7A, the first busbar 71A and the second busbar 72A face each other in a third direction D3 that is orthogonal or substantially orthogonal to both the first direction D1 and the second direction D2.

The plurality of first electrode fingers 73A are connected to the first busbar 71A, and extend toward the second busbar 72A. Here, the plurality of first electrode fingers 73A extend from the first busbar 71A along the third direction D3. Tips of the plurality of first electrode fingers 73A are separated from the second busbar 72A. For example, the plurality of first electrode fingers 73A have the same or substantially the same length and width as each other.

The plurality of second electrode fingers 74A are connected to the second busbar 72A, and extend toward the first busbar 71A. Here, the plurality of second electrode fingers 74A extend from the second busbar 72A along the third direction D3. Tips of the plurality of second electrode fingers 74A are separated from the first busbar 71A, respectively. For example, the plurality of second electrode fingers 74A have the same or substantially the same length and width as each other. In the example in FIG. 3A, the lengths and widths of the plurality of second electrode fingers 74A are the same or substantially the same as the lengths and widths of the plurality of first electrode fingers 73A, respectively.

In the IDT electrode 7A, the plurality of first electrode fingers 73A and the plurality of second electrode fingers 74A are alternately provided one by one with a space provided between the plurality of first electrode fingers 73A and the plurality of second electrode fingers 74A in the second direction D2. Therefore, the first electrode finger 73A and the second electrode finger 74A that are adjacent to each other in the longitudinal direction of the first busbar 71A are separated from each other. When the width of the first electrode finger 73A and the second electrode finger 74A is $W_A$ (see FIG. 3B) and a space width between the first electrode finger 73A and the second electrode finger 74A adjacent to each other is $S_A$, a duty ratio in the IDT electrode 7A is defined by $W_A/(W_A+S_A)$. The duty ratio of the IDT electrode 7A is preferably, for example, about 0.5. When the wavelength of the acoustic wave determined by the electrode finger period of the IDT electrode 7A is defined by λ, λ is equal or substantially equal to the electrode finger period. The electrode finger period is defined by a repetition period $P_{\lambda A}$ (see FIG. 3B) of the plurality of first electrode fingers 73A or the plurality of second electrode fingers 74A. Therefore, the repetition period $P_{\lambda A}$ and λ are equal or substantially equal to each other. The duty ratio of the IDT electrode 7A is a ratio of the width $W_A$ of the first electrode finger 73A and the second electrode finger 74A to a value $(W_A+S_A)$ that is half the electrode finger period.

A group of electrode fingers including the plurality of first electrode fingers 73A and the plurality of second electrode fingers 74A may include a space interposed between the plurality of first electrode finders 73A and the plurality of second electrode fingers 74A in the second direction D2, and the plurality of first electrode fingers 73A and the plurality of second electrode fingers 74A may not be alternately provided one by one with a space interposed between the plurality of first electrode fingers 73A and the plurality of second electrode fingers 74A. For example, a region in which the first electrode fingers 73A and the second electrode fingers 74A are provided one by one with a space interposed between the plurality of first electrode fingers 73A and the plurality of second electrode fingers 74A and a region in which the two first electrode fingers 73A or the two second electrode fingers 74A are provided side by side in the second direction D2 may be mixed. The number of the plurality of first electrode fingers 73A and the number of the plurality of second electrode fingers 74A in the IDT electrode 7A are not particularly limited.

(2.1.3) Low Acoustic Velocity Film

In the first acoustic wave resonator 3A, an acoustic velocity of an acoustic wave decreases by including the low acoustic velocity film 5A provided between the high acoustic velocity member 4A, which is the high acoustic velocity support substrate 42, and the piezoelectric layer 6A. An acoustic wave inherently concentrates in a low acoustic velocity medium. Therefore, in the first acoustic wave resonator 3A, the acoustic wave energy in the piezoelectric layer 6A and in the IDT electrode 7A in which the acoustic wave is excited is able to be further confined. Thus, in the first acoustic wave resonator 3A, a loss is able to be significantly reduced and the Q factor is able to be significantly increased as compared with a case where the low acoustic velocity film 5A is not provided.

The first acoustic wave resonator 3A may include, for example, an adhesive layer provided between the low acoustic velocity film 5A and the piezoelectric layer 6A. Accordingly, the first acoustic wave resonator 3A is able to significantly reduce or prevent peeling between the low acoustic velocity film 5A and the piezoelectric layer 6A. The adhesive layer is preferably made of, for example, resin (epoxy resin, polyimide resin, etc.), metal, or the like. In addition, the first acoustic wave resonator 3A may include not only the adhesive layer, but also a dielectric film provided between the low acoustic velocity film 5A and the piezoelectric layer 6A, on the piezoelectric layer 6A, or underneath the low acoustic velocity film 5A.

A material of the low acoustic velocity film 5A is preferably, for example, at least one material selected from a group including silicon oxide, glass, silicon oxynitride, tantalum oxide, and a compound in which fluorine, carbon, or boron is added to silicon oxide.

In the first acoustic wave resonator 3A, for example, when the low acoustic velocity film 5A is made of silicon oxide, frequency temperature characteristics are able to be significantly improved as compared with a case where the low acoustic velocity film 5A is not included. An elastic modulus of $LiTaO_3$ has negative temperature characteristics, and silicon oxide has positive temperature characteristics. Therefore, in the first acoustic wave resonator 3A, an absolute value of temperature coefficient of frequency (TCF) is able to be significantly reduced. Further, the specific acoustic impedance of silicon oxide is smaller than the specific acoustic impedance of $LiTaO_3$. Therefore, in the first acoustic wave resonator 3A, both an expansion in a fractional bandwidth due to an increase in an electromechanical coupling coefficient and a significant improvement in the frequency temperature characteristics are able to be provided.

A thickness of the low acoustic velocity film 5A is preferably, for example, about 2.0λ or less, where λ is the wavelength of the acoustic wave determined by the electrode finger period of the IDT electrode 7A.

(2.1.4) High Acoustic Velocity Member

The high acoustic velocity member 4A is the high acoustic velocity support substrate 42 that supports the piezoelectric layer 6A, the IDT electrode 7A, and the like. In the high acoustic velocity support substrate 42, the acoustic velocity of the bulk wave propagating through the high acoustic velocity support substrate 42 is higher than the acoustic velocity of the acoustic wave propagating through the piezoelectric layer 6A.

A planar view shape of the high acoustic velocity member 4A (outer peripheral shape when the high acoustic velocity member 4A is viewed from the first direction D1) is a rectangular or substantially rectangular shape, but is not limited to the rectangular or substantially rectangular shape, and may be, for example, a square or substantially square shape. The high acoustic velocity member 4A is a crystal substrate. Specifically, the high acoustic velocity member 4A is a crystal substrate having a cubic system crystal structure. As an example, the high acoustic velocity member 4A is a silicon substrate. A thickness of the high acoustic velocity member 4A is preferably, for example, about 120 µm. The crystal substrate having the crystal structure may be, for example, a germanium substrate, a diamond substrate, or the like, other than the silicon substrate. Therefore, a material of the high acoustic velocity member 4A is not limited to silicon, and may be, for example, silicon carbide, germanium, diamond, or the like.

(2.2) Configuration of SAW Resonator

Next, the SAW resonator 3B will be described with reference to FIGS. 4A and 4B.

Figure 4A:
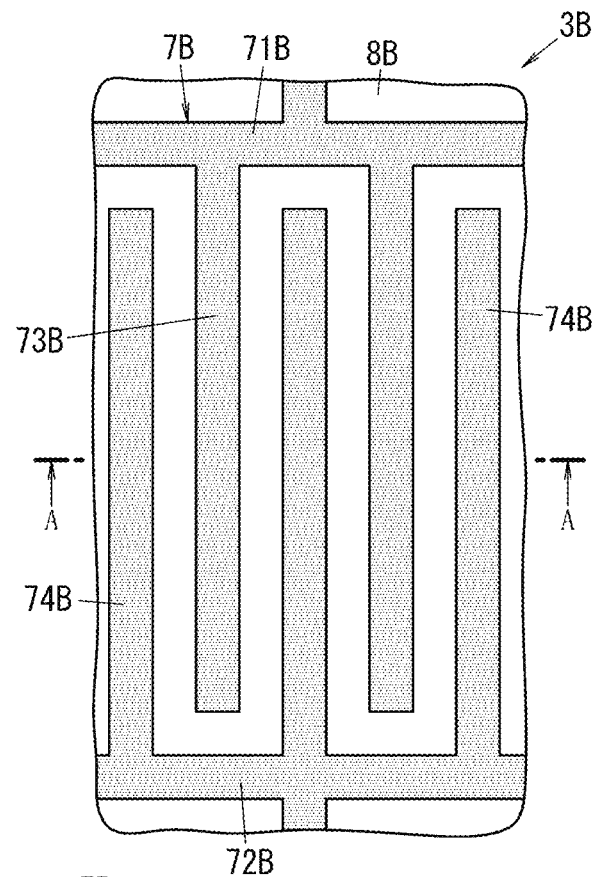
FIG. 4A is a plan view of a main portion of a SAW resonator in the acoustic wave device.
Figure 4B:
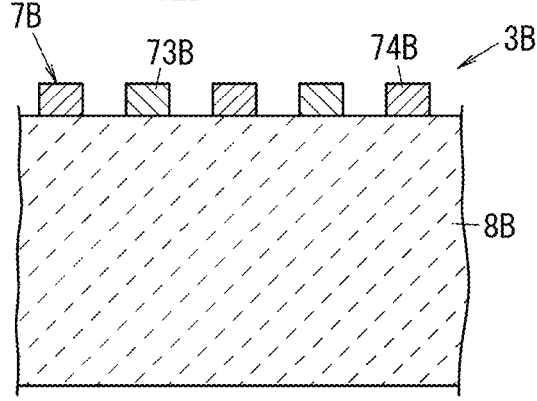
FIG. 4B is a sectional view taken along line A-A in FIG. 4A showing the SAW resonator in the acoustic wave device.

As shown in FIGS. 4A and 4B, the SAW resonator 3B includes a piezoelectric substrate 8B and an IDT electrode 7B provided on the piezoelectric substrate 8B.

(2.2.1) Piezoelectric Substrate

The piezoelectric substrate 8B is made of a piezoelectric material. As the piezoelectric material of the piezoelectric substrate 8B, an appropriate piezoelectric material, for example, $LiTaO_3$, $LiNbO_3$, quartz crystal, or the like is used.

(2.2.2) IDT Electrode

The IDT electrode 7B is similar to the IDT electrode 7A of the first acoustic wave resonator 3A (see FIGS. 3A and 3B). That is, the IDT electrode 7B includes a first busbar 71B, a second busbar 72B, a plurality of first electrode fingers 73B, and a plurality of second electrode fingers 74B, which are similar to the first busbar 71A, the second busbar 72A, the plurality of first electrode fingers 73A, and the plurality of second electrode fingers 74A of the IDT electrode 7A, respectively.

(3) Characteristics of Acoustic Wave Resonator

Figure 5:
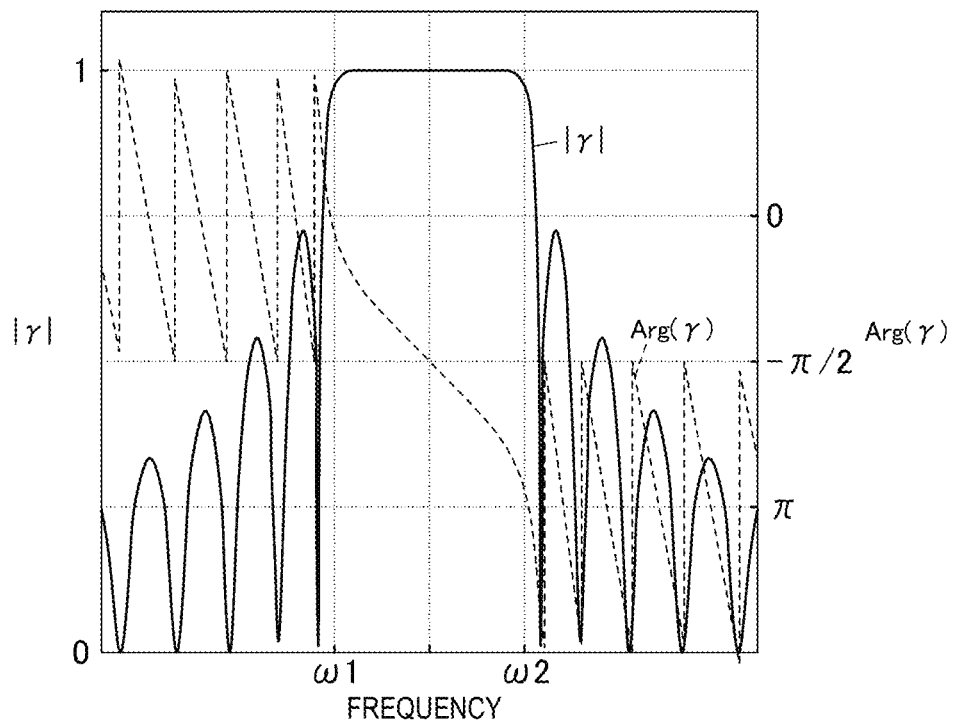
FIG. 5 is a reflection characteristic diagram of the first acoustic wave resonator in the acoustic wave device.
Figure 6:
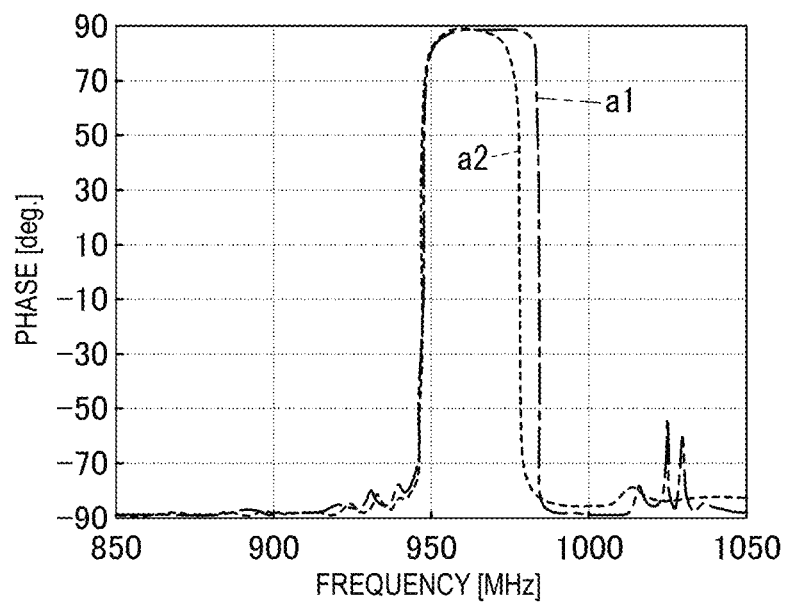
FIG. 6 is a graph showing phase frequency characteristics of the SAW resonator and the first acoustic wave resonator in the acoustic wave device, respectively.

Next, characteristics of the first acoustic wave resonator 3A and the SAW resonator 3B will be described with reference to FIGS. 5 and 6. In FIG. 5, a horizontal axis represents a frequency, a left vertical axis represents an absolute value of a reflection coefficient γ, and a right vertical axis represents an argument of the reflection coefficient γ. In the horizontal axis in FIG. 5, ω2 is an upper limit frequency of a stopband, and ω1 is a lower limit frequency of the stopband. In addition, Arg (γ) has the same meaning as "∠Γ" described in, for example, a reference, Kenya Hashimoto; *Introduction to simulation technologies for surface acoustic wave devices*; Realize: p 215. In FIG. 6, a horizontal axis represents a frequency, and a vertical axis represents an impedance phase. In addition, in FIG. 6, a long dashed short dashed line a1 is for the first acoustic wave resonator 3A, and a broken line a2 is for the SAW resonator 3B.

From FIG. 6, in the first acoustic wave resonator 3A, a stopband ripple occurs on the higher frequency side than the anti-resonant frequency in a phase characteristic of impedance. The "stopband ripple" as described herein refers to a ripple that occurs at the frequency higher than the anti-resonant frequency due to the influence of the stopband edge in the phase characteristic of impedance of the acoustic wave resonator. More specifically, the "stopband ripple" is a ripple occurs due to the influence of a sidelobe characteristic, which is a reflection characteristic of the IDT electrode (see FIG. 5) on a higher frequency side than the upper limit frequency (stopband edge) of the stopband (inhibition zone) for the acoustic wave. The stopband is a frequency band in which a Bragg reflection for an acoustic wave occurs. A Bragg frequency of the Bragg reflection, which is a center frequency of a reflection band, is determined by the electrode finger period and the acoustic velocity of the acoustic wave. A width of the reflection band is determined by the material and thickness of the IDT electrode, the width of the electrode finger, and the like.

In the example in FIG. 6, the stopband ripple of the first acoustic wave resonator 3A occurs at about 1030 MHz. On the other hand, in the SAW resonator 3B, a stopband ripple does not occur at about 1030 MHz in the phase characteristic of impedance. In addition, the inventors of preferred embodiments of the present invention have discovered that when a filter includes a plurality of acoustic wave resonators, an acoustic wave resonator that is electrically closest to an antenna among the plurality of acoustic wave resonators has a large influence on the stopband ripple. Therefore, when the filter is defined by the plurality of acoustic wave resonators, at least the acoustic wave resonator which is electrically closest to the antenna (antenna end resonator) among the plurality of acoustic wave resonators is preferably the SAW resonator 3B, for example. Accordingly, the stopband ripple is able to be significantly reduced as compared with a case where all of the plurality of acoustic wave resonators are the first acoustic wave resonators 3A.

Further, from FIG. 6, in the SAW resonator 3B, the reflection characteristic of the stopband is lower than in the first acoustic wave resonator 3A. Therefore, at least one acoustic wave resonator other than the antenna end resonator among the plurality of acoustic wave resonators is preferably the first acoustic wave resonator 3A, for example.

In the acoustic wave device 1 of the present preferred embodiment, the acoustic wave resonator (antenna end resonator) 31 that is electrically closest to the first terminal 101 is the SAW resonator 3B, and the acoustic wave resonators 33 to 39 are the first acoustic wave resonators 3A.

Accordingly, the stopband ripple on the higher frequency side than the anti-resonant frequency is able to be significantly reduced while significantly reducing or preventing the deterioration of the reflection characteristic and the bandpass characteristic.

Further, by including at least one acoustic wave resonator other than the antenna end resonator among the plurality of acoustic wave resonators as the first acoustic wave resonator 3A, the frequency temperature characteristics are able to be significantly improved as compared with a case where all of the plurality of acoustic wave resonators are the SAW resonators 3B.

Figure 7:
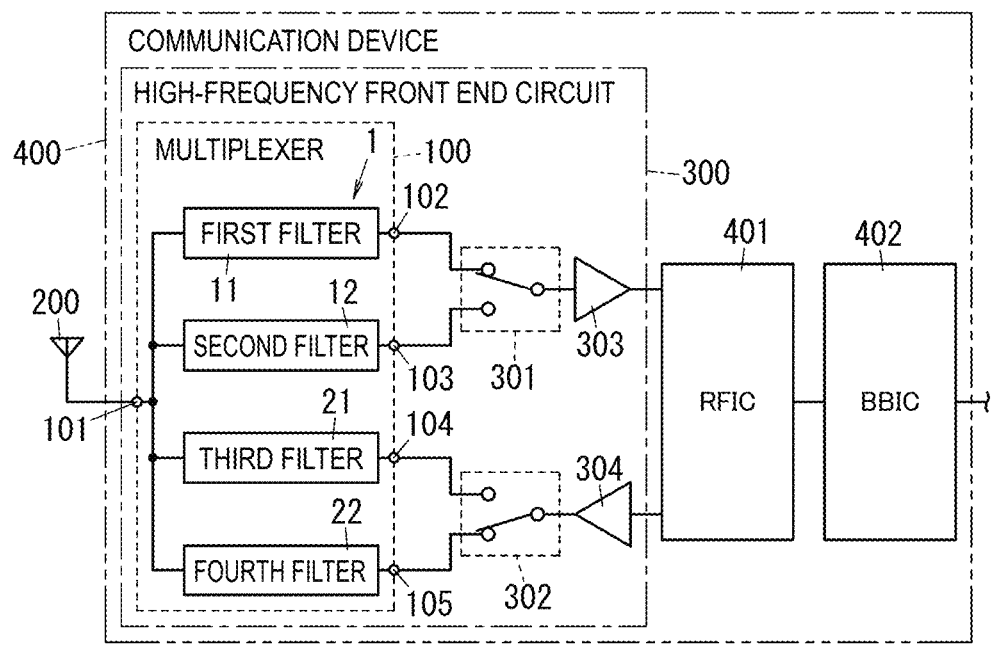
FIG. 7 is a diagram of a multiplexer, a high-frequency front end circuit, and a communication device, including the acoustic wave device.

(4) Configuration of Multiplexer, High-frequency Front End Circuit, and Communication Device As shown in FIG. 7, the acoustic wave device 1 according to the present preferred embodiment is able to be applied to the multiplexer 100, the high-frequency front end circuit 300 including the multiplexer 100, and the communication device 400 including the high-frequency front end circuit 300. Hereinafter, the multiplexer 100, the high-frequency front end circuit 300, and the communication device 400 will be described with reference to FIG. 7.

(4.1) Multiplexer

As shown in FIG. 7, the multiplexer 100 according to the present preferred embodiment includes the first terminal 101, the second terminal 102, a third terminal 103, the first filter 11 including the acoustic wave device 1 and the second filter 12.

The first terminal 101 is the antenna terminal that is able to be electrically connected to the antenna 200 outside the multiplexer 100.

The first filter 11 is a first reception-side filter provided between the first terminal 101 and the second terminal 102. The first filter 11 passes signals in a pass band of the first filter 11 and attenuates signals outside the pass band.

The second filter 12 is a second reception-side filter provided between the first terminal 101 and the third terminal 103. The second filter 12 passes signals in a pass band of the second filter 12 and attenuates signals outside the pass band.

The first filter 11 and the second filter 12 have different pass bands from each other. In the multiplexer 100, the pass band of the first filter 11 is a lower frequency band than the pass band of the second filter 12. Therefore, in the multiplexer 100, the pass band of the second filter 12 is on a higher frequency side than the pass band of the first filter 11. In the multiplexer 100, for example, a highest frequency of the pass band of the first filter 11 is lower than a lowest frequency of the pass band of the second filter 12.

In the multiplexer 100, the first filter 11 and the second filter 12 are connected to the common first terminal 101.

As shown in FIG. 7, the multiplexer 100 further includes a fourth terminal 104, a fifth terminal 105, the third filter 21, and the fourth filter 22. However, in the multiplexer 100, the fourth terminal 104, the fifth terminal 105, the third filter 21, and the fourth filter 22 are not essential components.

The third filter 21 is a first transmission-side filter provided between the first terminal 101 and the fourth terminal 104. The third filter 21 passes signals in a pass band of the third filter 21 and attenuates signals outside the pass band.

The fourth filter 22 is a second transmission-side filter provided between the first terminal 101 and the fifth terminal 105. The fourth filter 22 passes signals in a pass band of the fourth filter 22 and attenuates signals outside the pass band.

In the multiplexer 100, the antenna end resonator 31 of the first filter 11 is the SAW resonator 3B, and the acoustic wave resonators 33 to 39 are the first acoustic wave resonators 3A.

Therefore, as in the multiplexer 100 according to the present preferred embodiment, when the pass band of the second filter 12 is on the higher frequency side than the pass band of the first filter 11, the influence of the stopband ripple which occurs in the first filter 11 on the second filter 12 is able to be significantly reduced or prevented.

(4.2) High-Frequency Front End Circuit

As shown in FIG. 7, the high-frequency front end circuit 300 includes the multiplexer 100, an amplifier circuit 303 (hereinafter, also referred to as a first amplifier circuit 303), and a switch circuit 301 (hereinafter, also referred to as a first switch circuit 301). The high-frequency front end circuit 300 further includes an amplifier circuit 304 (hereinafter, also referred to as a second amplifier circuit 304) and a switch circuit 302 (hereinafter also referred to as a second switch circuit 302). However, in the high-frequency front end circuit 300, the second amplifier circuit 304 and the second switch circuit 302 are not essential components.

The first amplifier circuit 303 amplifies and outputs a high-frequency signal (received signal) that has passed through the antenna 200, the multiplexer 100, and the first switch circuit 301. The first amplifier circuit 303 is a low noise amplifier circuit.

The first switch circuit 301 has two terminals to be selected individually connected to the second terminal 102 and the third terminal 103 of the multiplexer 100 and a common terminal connected to the first amplifier circuit 303. That is, the first switch circuit 301 is connected to the first filter 11 via the second terminal 102, and is connected to the second filter 12 via the third terminal 103.

The first switch circuit 301 is preferably, for example, a single pole double throw (SPDT) switch. The first switch circuit 301 is controlled by a control circuit. The first switch circuit 301 connects the common terminal and one of the terminals to be selected following a control signal from the control circuit. The first switch circuit 301 may be, for example, a switch integrated circuit (IC). Note that, in the first switch circuit 301, the number of terminals to be selected connected to the common terminal is not limited to two, and three terminals or more may be provided. That is, the high-frequency front end circuit 300 may support carrier aggregation.

The second amplifier circuit 304 amplifies a high-frequency signal (transmitted signal) outputted from the outside of the high-frequency front end circuit 300 (for example, an RF signal processing circuit 401 which will be described later), and the amplified high-frequency signal is outputted to the antenna 200 via the second switch circuit 302 and the multiplexer 100. The second amplifier circuit 304 is a power amplifier circuit.

The second switch circuit 302 is preferably, for example, a SPDT switch. The second switch circuit 302 is controlled by the control circuit. The second switch circuit 302 connects a common terminal and one of terminals to be selected following a control signal from the control circuit. The second switch circuit 302 may be, for example, a switch IC. Note that, in the second switch circuit 302, the number of terminals to be selected connected to the common terminal is not limited to one, and a plurality of terminals may be provided.

The high-frequency front end circuit 300 includes the multiplexer 100. Therefore, similar to the multiplexer 100, the influence of the stopband ripple which occurs in the first filter 11 on the second filter 12 is able to be significantly reduced or prevented.

(4.3) Communication Device

As shown in FIG. 7, the communication device 400 includes the RF signal processing circuit 401 and the high-frequency front end circuit 300. The RF signal processing circuit 401 processes a high-frequency signal received by the antenna 200. The high-frequency front end circuit 300 communicates high-frequency signals (received signal and transmitted signal) between the antenna 200 and the RF signal processing circuit 401. The communication device 400 further includes a baseband signal processing circuit 402. However, in the communication device 400, the baseband signal processing circuit 402 may or may not be included in the signal processing circuit. That is, the signal processing circuit may include only the RF signal processing circuit 401.

The RF signal processing circuit 401 is preferably, for example, a radio frequency integrated circuit (RFIC), and performs signal processing on a high-frequency signal (received signal). For example, the RF signal processing circuit 401 performs signal processing, for example, down-conversion on a high-frequency signal (received signal) input from the antenna 200 via the high-frequency front end circuit 300, and outputs a received signal generated by the signal processing to the baseband signal processing circuit 402. The baseband signal processing circuit 402 is, for example, a baseband integrated circuit (BBIC). The received signal processed by the baseband signal processing circuit 402 is provided, for example, as an image signal for image display, or as an audio signal for a call.

Further, for example, the RF signal processing circuit 401 performs signal processing, for example, up-conversion on a high-frequency signal (transmitted signal) outputted from the baseband signal processing circuit 402, and outputs a high-frequency signal subjected to the signal processing to the second amplifier circuit 304. The baseband signal processing circuit 402 performs predetermined signal processing on a transmitted signal from the outside of the communication device 400, for example.

The communication device 400 includes the high-frequency front end circuit 300 including the multiplexer 100. Therefore, similar to the multiplexer 100, the influence of the stopband ripple which occurs in the first filter 11 on the second filter 12 is able to be significantly reduced or prevented.

(5) Advantageous Effects

The acoustic wave device 1 according to the present preferred embodiment is provided between the first terminal 101 which is the antenna terminal and the second terminal 102 which is different from the first terminal 101. The acoustic wave device 1 includes the plurality of acoustic wave resonators 31 to 39.

The plurality of acoustic wave resonators 31 to 39 include the plurality of series arm resonators 31, 33, 35, 37, and 39 and the plurality of parallel arm resonators 32, 34, 36, and 38. The plurality of series arm resonators 31, 33, 35, 37, and 39 are provided on the first path r1 connecting the first terminal 101 and the second terminal 102. The plurality of parallel arm resonators 32, 34, 36, and 38 are provided on the plurality of second paths r21, r22, r23, and r24 that connects each of the plurality of nodes N1, N2, N3, and N4 on the first path r1 and the ground.

When the acoustic wave resonator 31 which is electrically closest to the first terminal 101 among the plurality of acoustic wave resonators 31 to 39 is the antenna end resonator, the antenna end resonator 31 is the SAW resonator 3B or the BAW resonator 3C or 3D. The at least one acoustic wave resonator other than the antenna end resonator 31 among the plurality of acoustic wave resonators 31 to 39 is the first acoustic wave resonator 3A.

The SAW resonator 3B includes the piezoelectric substrate 8B and the IDT electrode 7B that is provided on the piezoelectric substrate 8B and includes the plurality of first electrode fingers 73B and second electrode fingers 74B.

The first acoustic wave resonator 3A includes the piezoelectric layer 6A, the IDT electrode 7A that is provided on the piezoelectric layer 6A and includes the plurality of first electrode fingers 73A and second electrode fingers 74A, and the high acoustic velocity member 4A. The high acoustic velocity member 4A is located on the side opposite to the IDT electrode 7A with the piezoelectric layer 6A interposed between the high acoustic velocity layer 4A and the IDT electrode 7A. The acoustic velocity of the bulk wave propagating through the high acoustic velocity member 4A is higher than the acoustic velocity of the acoustic wave propagating through the piezoelectric layer 6A. The thickness of the piezoelectric layer 6A is about $3.5\lambda$ or less when the wavelength of the acoustic wave determined by the electrode finger period of the IDT electrode 7A is $\lambda$.

In the acoustic wave device 1 according to the present preferred embodiment, the antenna end resonator (series arm resonator) 31 electrically closest to the first terminal 101, which is the antenna terminal electrically connected to the antenna 200, is the SAW resonator 3B. Therefore, the stopband ripple on the higher frequency side than the anti-resonant frequency is able to be significantly reduced or prevented. Further, in the acoustic wave device 1 according to the present preferred embodiment, the acoustic wave resonators 33 to 39 other than the antenna end resonator 31 and the parallel arm resonator 32 among the plurality of acoustic wave resonators 31 to 39 are the first acoustic wave resonators 3A. Therefore, the deterioration of the bandpass characteristic and the reflection characteristic is able to be significantly reduced or prevented.

(6) Modification

The present preferred embodiment described above is merely one of the various preferred embodiments of the present invention. The present preferred embodiment described above may be modified in various ways responding to design and the like. Hereinafter, modifications of the present preferred embodiment described above will be provided. The modifications described below may be applied in appropriate combination.

(6.1) Modification 1

Figure 8A:
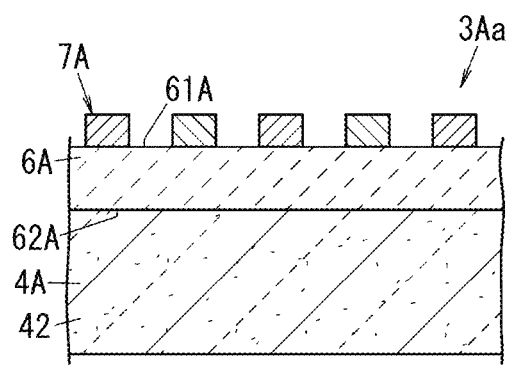
FIG. 8A is a sectional view of a first acoustic wave resonator in an acoustic wave device according to Modification 1 of a preferred embodiment of the present invention.

In the preferred embodiment described above, the case where the first acoustic wave resonator 3A has the three-layer structure is described as an example, but it may have a two-layer structure. Hereinafter, a first acoustic wave resonator 3Aa having the two-layer structure will be described with reference to FIG. 8A. FIG. 8A is a sectional view of the first acoustic wave resonator 3Aa having the two-layer structure. Note that, in Modification 1 of the present preferred embodiment, the same or similar components as the components in the first acoustic wave resonator 3A are denoted by the same reference numerals, and the description thereof will be omitted.

As shown in FIG. 8A, the first acoustic wave resonator 3Aa includes the high acoustic velocity member 4A, the piezoelectric layer 6A, and the IDT electrode 7A. That is, the low acoustic velocity film 5A is omitted from the first acoustic wave resonator 3Aa. In the first acoustic wave resonator 3Aa, the piezoelectric layer 6A is provided on the high acoustic velocity member 4A. The first acoustic wave resonator 3Aa may include an adhesive layer, a dielectric film, or the like between the high acoustic velocity member 4A and the piezoelectric layer 6A.

By including the first acoustic wave resonator 3Aa according to Modification 1 for at least one acoustic wave resonator of the acoustic wave device 1 other than the antenna end resonator 31, the deterioration of the bandpass characteristic and the reflection characteristic of the first filter 11 is able to be significantly reduced or prevented.

(6.2) Modification 2

Figure 8B:
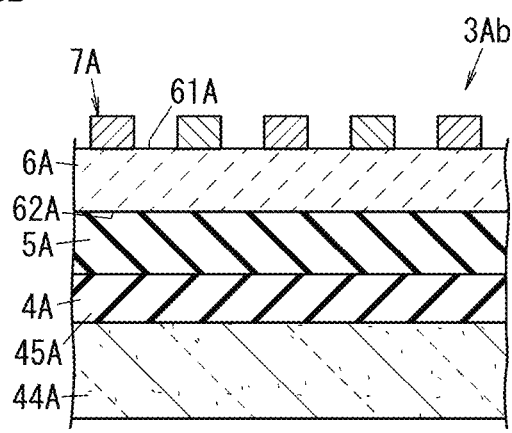
FIG. 8B is a sectional view of a first acoustic wave resonator in an acoustic wave device according to Modification 2 of a preferred embodiment of the present invention.

In the preferred embodiment described above, the case where the first acoustic wave resonator 3A has the three-layer structure is described as an example, but it may have a four-layer structure. Hereinafter, a first acoustic wave resonator 3Ab having the four-layer structure will be described with reference to FIG. 8B. FIG. 8B is a sectional view of the first acoustic wave resonator 3Ab having the four-layer structure. Note that, in Modification 2 of the present preferred embodiment, the same or similar components as the components in the first acoustic wave resonator 3A are denoted by the same reference numerals, and the description thereof will be omitted.

As shown in FIG. 8B, the first acoustic wave resonator 3Ab includes the high acoustic velocity member 4A, the low acoustic velocity film 5A, the piezoelectric layer 6A, and the IDT electrode 7A. In addition, the high acoustic velocity member 4A includes a support substrate 44A and a high acoustic velocity film 45A. The high acoustic velocity film 45A is provided on the support substrate 44A. The expression "provided on the support substrate 44A" as described herein includes a case directly provided on the support substrate 44A, and a case indirectly provided on the support substrate 44A. In the high acoustic velocity film 45A, the acoustic velocity of a slowest bulk wave among the plurality of bulk waves propagating therethrough is higher than the acoustic velocity of the acoustic wave propagating through the piezoelectric layer 6A. The low acoustic velocity film 5A is provided on the high acoustic velocity film 45A. The expression "provided on the high acoustic velocity film 45A" as described herein includes a case directly provided on the high acoustic velocity film 45A, and a case indirectly provided on the high acoustic velocity film 45A. In the low acoustic velocity film 5A, the acoustic velocity of a transversal bulk wave propagating through the low acoustic velocity film 5A is lower than the acoustic velocity of the bulk wave propagating through the piezoelectric layer 6A. The piezoelectric layer 6A is provided on the low acoustic velocity film 5A. The expression "provided on the low acoustic velocity film 5A" as described herein includes a case directly provided on the low acoustic velocity film 5A, and a case indirectly provided on the low acoustic velocity film 5A.

A material of the support substrate 44A is, for example, silicon, but is not limited thereto, and may be a piezoelectric material, for example, sapphire, lithium tantalate, lithium niobate, quartz crystal, or the like, various ceramics, for example, alumina, magnesia, silicon nitride, aluminum nitride, silicon carbide, zirconia, cordierite, mullite, steatite, forsterite, or the like, dielectrics, for example, glass, semiconductors, for example, gallium nitride, resin, or the like.

In the first acoustic wave resonator 3Ab, the high acoustic velocity film 45A confines the acoustic wave in a portion where the piezoelectric layer 6A and the low acoustic velocity film 5A are laminated, and to prevent the acoustic wave from leaking to the structure below the high acoustic velocity film 45A.

In the first acoustic wave resonator 3Ab, when a thickness of the high acoustic velocity film 45A is sufficiently thick, the energy of the acoustic wave in a specific mode that provides the characteristics of the filter and the resonator is distributed throughout the piezoelectric layer 6A and the low acoustic velocity film 5A, is also distributed in a portion of the high acoustic velocity film 45A on a low acoustic velocity film 5A side, and is not distributed in the support substrate 44A. The acoustic wave is confined by the high acoustic velocity film 45A similar to a case of a surface acoustic wave as a Love wave which is a non-leaking SH wave, and is described in, for example, a reference, Kenya Hashimoto; *Introduction to simulation technologies for surface acoustic wave devices*; Realize: pp 26-28. Confining a surface acoustic wave as described above is different from confining an acoustic wave by a Bragg reflector with an acoustic multilayer film.

A material of the high acoustic velocity film 45A is, for example, at least one material selected from a group including diamond-like carbon, aluminum nitride, aluminum oxide, silicon carbide, silicon nitride, silicon, sapphire, lithium tantalate, lithium niobate, quartz crystal, alumina, zirconia, cordierite, mullite, steatite, forsterite, magnesia, and diamond.

A thickness of the high acoustic velocity film 45A is preferably, for example, relatively thick to confine the acoustic wave in the piezoelectric layer 6A and the low acoustic velocity film 5A. The first acoustic wave resonator 3Ab may include an adhesive layer, a dielectric film, or the like, in addition to the high acoustic velocity film 45A, the low acoustic velocity film 5A, and the piezoelectric layer 6A.

By including the first acoustic wave resonator 3Ab according to Modification 2 for at least one acoustic wave resonator of the acoustic wave device 1 other than the antenna end resonator 31, the deterioration of the bandpass characteristic and the reflection characteristic of the first filter 11 is able to be significantly reduced or prevented.

(6.3) Modification 3

Hereinafter, a multiplexer 100b according to Modification 3 of the present preferred embodiment will be described with reference to FIG. 9.

Figure 9:
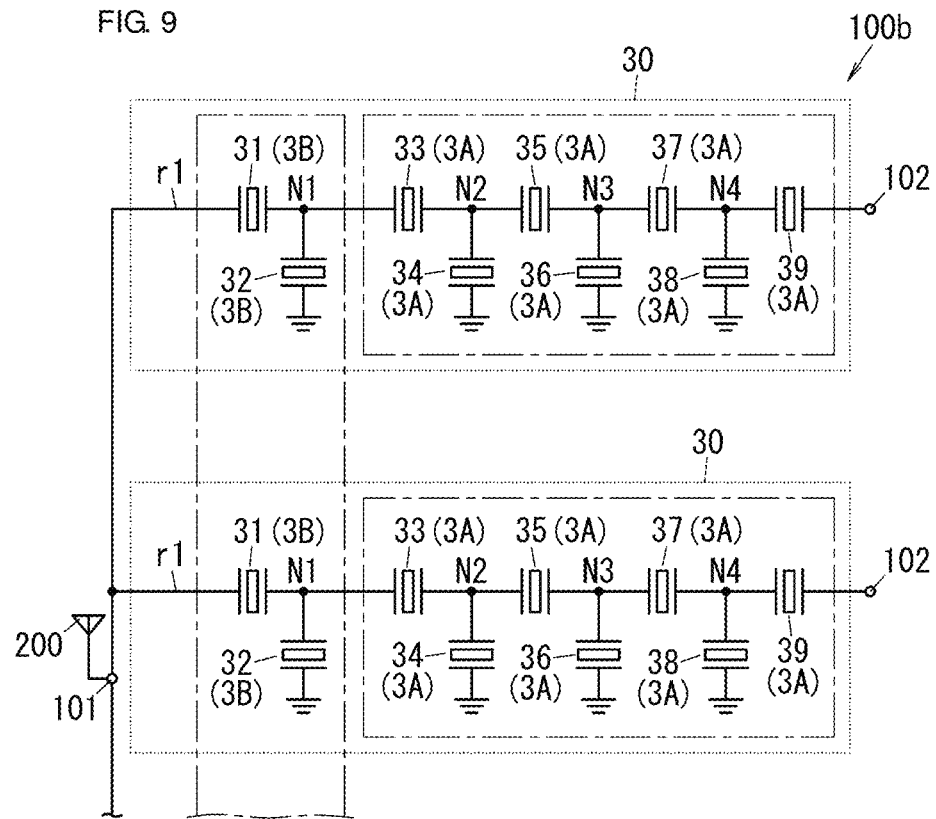
FIG. 9 is a circuit diagram of an acoustic wave device according to Modification 3 of a preferred embodiment of the present invention.

As shown in FIG. 9, the multiplexer 100b according to Modification 3 includes a plurality (two in the shown example) of resonator groups 30. Each of the plurality of resonator groups 30 includes the plurality of acoustic wave resonators 31 to 39.

The plurality of acoustic wave resonators 31 to 39 include the plurality of series arm resonators 31, 33, 35, 37, and 39 and the plurality of parallel arm resonators 32, 34, 36, and 38. The series arm resonator 31 and the parallel arm resonator 32 among the plurality of acoustic wave resonators 31 to 39 are the SAW resonators 3B. The remaining series arm resonators 33, 35, 37, and 39 and the remaining parallel arm resonators 34, 36, and 38 are the first acoustic wave resonators 3A. In Modification 3, the acoustic wave resonator 31 that is electrically closest to the first terminal 101 is the antenna end resonator (hereinafter, also referred to as the "antenna end resonator 31"). In Modification 3, the plurality of antenna end resonators 31 included in the plurality of resonator groups 30 is integrated in one chip. In the example in FIG. 9, the acoustic wave resonators (acoustic wave resonators 31 and 32) surrounded by a long dashed short dashed line are integrated in the one chip.

Here, it is assumed that one of the plurality of resonator groups 30 (upper side in FIG. 9) is the first filter, and another (lower side in FIG. 9) is the second filter. Accordingly, by integrating the antenna end resonators 31 of the respective filters in the one chip, the number of chips is able to be significantly reduced as compared with a case where the antenna end resonators 31 are separate chips, respectively. Thus, the size of the multiplexer 100b is able to be significantly reduced. Further, fluctuations in frequency characteristics due to manufacturing variations of the multiplexer 100b is greatly influenced by the manufacturing variations of each chip. Thus, the fluctuations in the frequency characteristics are able to be significantly reduced or prevented by reducing the number of chips.

Note that, in the multiplexer 100b according to Modification 3, the acoustic wave resonators 31 and 32 of the plurality of resonator groups 30 are integrated in the one chip, but it is sufficient that at least the acoustic wave resonators 31 of the plurality of resonator groups 30 are integrated in one chip.

(6.4) Modification 4

Figure 10:
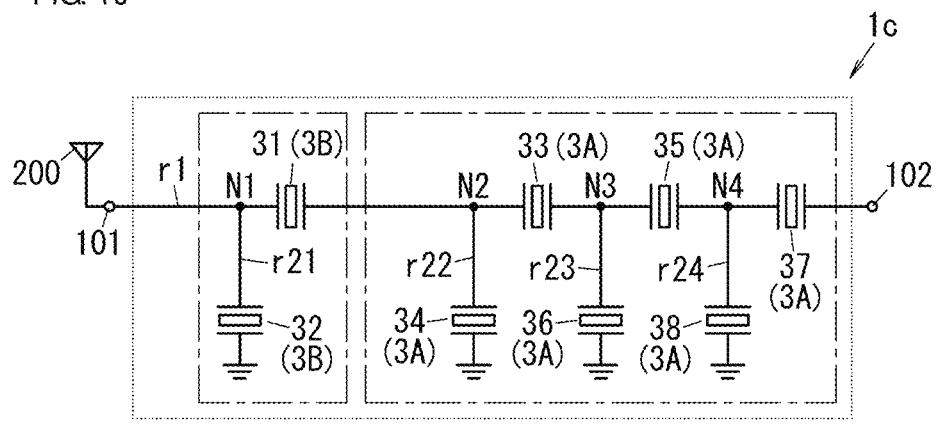
FIG. 10 is a circuit diagram of an acoustic wave device according to Modification 4 of a preferred embodiment of the present invention.

In the preferred embodiment described above, the case where the series arm resonator 31 is the antenna end resonator is described as an example, but as shown in FIG. 10, the parallel arm resonator 32 may be the antenna end resonator. Hereinafter, an acoustic wave device 1c according to Modification 4 of the present preferred embodiment will be described with reference to FIG. 10.

As shown in FIG. 10, the acoustic wave device 1c according to Modification 4 includes a plurality (eight in the shown example) of acoustic wave resonators 31 to 38. The plurality of acoustic wave resonators 31 to 38 include a plurality (four in the shown example) of series arm resonators 31, 33, 35, and 37 and a plurality (four in the shown example) of parallel arm resonators 32, 34, 36, and 38.

In the example in FIG. 10, the series arm resonator 31 and the parallel arm resonator 32 are directly connected to the first terminal 101 which is the antenna terminal. The expression "the series arm resonator 31 is directly connected to the first terminal 101" as described herein means that the series arm resonator 31 is electrically connected to the first terminal 101 without passing through the other acoustic wave resonators 32 to 38. Further, the expression "the parallel arm resonator 32 is directly connected to the first terminal 101" as described herein means that the parallel arm resonator 32 is electrically connected to the first terminal 101 without passing through the other acoustic wave resonators 31 and 33 to 38. In Modification 4, the series arm resonator 31 and the parallel arm resonator 32 are the antenna end resonators. That is, in Modification 4, the series arm resonator 31 and the parallel arm resonator 32 are the SAW resonators 3B. Further, in Modification 4, the remaining series arm resonators 33, 35, and 37 and the remaining parallel arm resonators 34, 36, and 38 are the first acoustic wave resonators 3A.

In Modification 4, as shown in FIG. 10, the series arm resonator 31 and the parallel arm resonator 32, which are the antenna end resonators, are integrated in one chip. Further, the series arm resonators 33, 35, and 37 and the parallel arm resonators 34, 36, and 38 other than the antenna end resonators are integrated in another chip.

In Modification 4, as described above, the series arm resonator 31 and the parallel arm resonator 32, which are the antenna end resonators, are the SAW resonators 3B. Therefore, when a multiplexer includes the acoustic wave device 1c as the first filter, the stopband ripple on the higher frequency side than the anti-resonant frequency is able to be significantly reduced or prevented.

Note that both the series arm resonator 31 and the parallel arm resonator 32 may not be the antenna end resonator. In other words, at least one of the series arm resonator 31 and the parallel arm resonator 32 may be the antenna end resonator.

(6.5) Modification 5

Figure 11A:
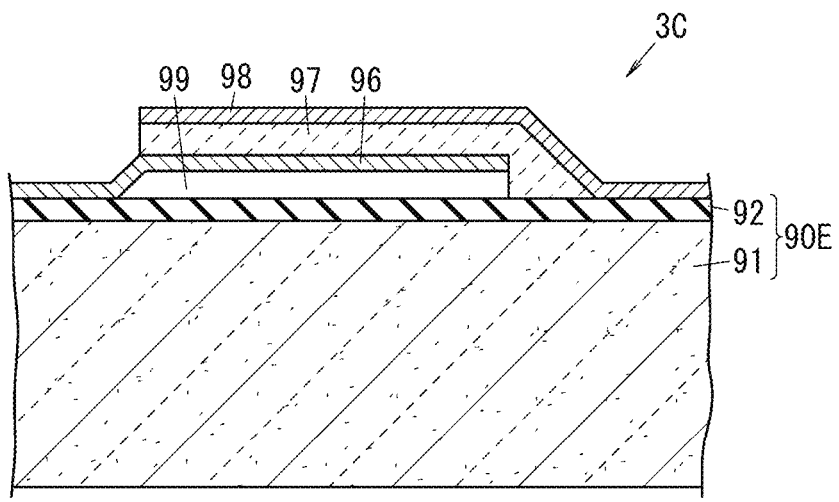
FIG. 11A is a sectional view of a BAW resonator in an acoustic wave device according to Modification 5 of a preferred embodiment of the present invention.

In the preferred embodiment described above, the case where the series arm resonator (antenna end resonator) 31 and the parallel arm resonator 32 are the SAW resonators 3B is described as an example, but as shown in FIG. 11A, the series arm resonator 31 and the parallel arm resonator 32 may be bulk acoustic wave (BAW) resonators 3C. Hereinafter, the BAW resonator 3C according to Modification 5 of the present preferred embodiment will be described with reference to FIG. 11A.

As shown in FIG. 11A, the BAW resonator 3C includes a first electrode 96, a piezoelectric film 97, and a second electrode 98. The piezoelectric film 97 is provided on the first electrode 96. The second electrode 98 is provided on the piezoelectric film 97.

The BAW resonator 3C further includes a support member 90E. The support member 90E supports the first electrode 96, the piezoelectric film 97, and the second electrode 98. The support member 90E includes a support substrate 91 and an electrical insulating film 92 provided on the support substrate 91. The support substrate 91 is preferably, for example, a silicon substrate. The electrical insulating film 92 is preferably, for example, a silicon oxide film. The piezoelectric film 97 is preferably made of, for example, lead zirconate titanate (PZT).

The BAW resonator 3C includes a cavity 99 on a side of the first electrode 96 opposite to a piezoelectric film 97 side. The BAW resonator 3C is able to significantly reduce or prevent the propagation of acoustic wave energy toward a support member 90E side by increasing an acoustic impedance ratio between the first electrode 96 and the medium directly below the first electrode 96, and is able to significantly increase an electromechanical coupling coefficient as compared with a case where the cavity 99 is not provided. The BAW resonator 3C is preferably, for example, a film bulk acoustic resonator (FBAR). The structure of the BAW resonator 3C defining the FBAR is an example, and is not particularly limited.

In the BAW resonator 3C, similarly to the SAW resonator 3B, the stopband ripple does not occur on the higher frequency side than the anti-resonant frequency in the phase characteristic of impedance. In addition, in the BAW resonator 3C, as similar to the SAW resonator 3B, the reflection characteristic of the stopband is lower than in the first acoustic wave resonator 3A.

In Modification 5, by including the BAW resonator 3C as the antenna end resonator, similar to the case where the antenna end resonator is the SAW resonator 3B, the stopband ripple on the higher frequency side than the anti-resonant frequency is able to be significantly reduced or prevented.

(6.6) Modification 6

Figure 11B:
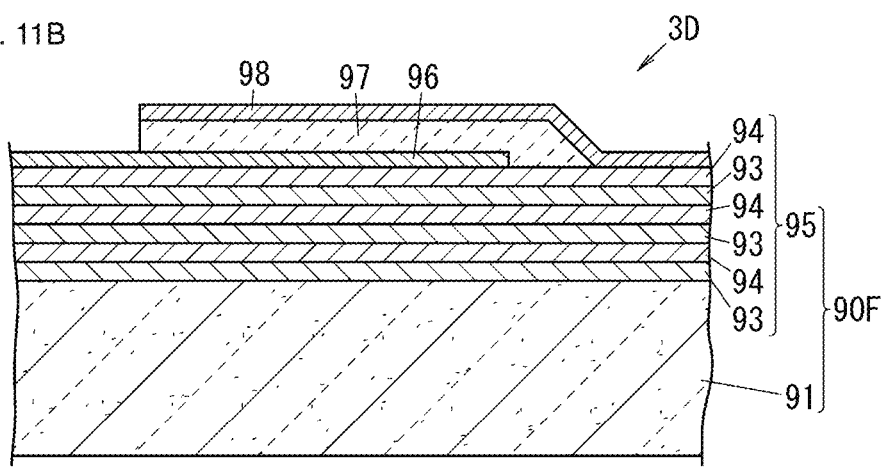
FIG. 11B is a sectional view of a BAW resonator in an acoustic wave device according to Modification 6 of a preferred embodiment of the present invention.

In the preferred embodiment described above, the case where the series arm resonator (antenna end resonator) 31 and the parallel arm resonator 32 are the SAW resonators 3B is described as an example, but as shown in FIG. 11B, the series arm resonator 31 and the parallel arm resonator 32 may be BAW resonators 3D. Hereinafter, the BAW resonator 3D according to Modification 6 of the present preferred embodiment will be described with reference to FIG. 11B.

As shown in FIG. 11B, the BAW resonator 3D includes the first electrode 96, the piezoelectric film 97, and the second electrode 98. The piezoelectric film 97 is provided on the first electrode 96. The second electrode 98 is provided on the piezoelectric film 97.

The BAW resonator 3D further includes a support member 90F. The support member 90F supports the first electrode 96, the piezoelectric film 97, and the second electrode 98. The support member 90F includes the support substrate 91 and an acoustic multilayer film 95 provided on the support substrate 91. The acoustic multilayer film 95 reflects a bulk acoustic wave generated in the piezoelectric film 97. The acoustic multilayer film 95 has a structure in which a plurality of high acoustic impedance layers 93 having relatively high acoustic impedance and a plurality of low acoustic impedance layers 94 having relatively low acoustic impedance are alternately provided one by one in a thickness direction of the support substrate 91. A material of the high acoustic impedance layer 93 is preferably, for example, Pt. A material of the low acoustic impedance layer 94 is preferably, for example, silicon oxide. The support substrate 91 is preferably, for example, a silicon substrate. The piezoelectric film 97 is preferably made of, for example, lead zirconate titanate (PZT).

The BAW resonator 3D has the acoustic multilayer film 95 on a side of the first electrode 96 opposite to a piezoelectric film 97 side. The BAW resonator 3D is a solidly mounted resonator (SMR). The structure of the BAW resonator 3D defining the SMR is an example, and is not particularly limited.

In the BAW resonator 3D, similarly to the SAW resonator 3B, the stopband ripple does not occur on the higher frequency side than the anti-resonant frequency in the phase characteristic of impedance. In addition, in the BAW resonator 3D, as similar to the SAW resonator 3B, the reflection characteristic of the stopband is lower than in the first acoustic wave resonator 3A.

In Modification 6, by including the BAW resonator 3D as the antenna end resonator, as similar to the case where the antenna end resonator is the SAW resonator 3B, the stopband ripple on the higher frequency side than the anti-resonant frequency is able to be significantly reduced or prevented.

The following features are disclosed below with reference to the present preferred embodiment and Modifications described above.

An acoustic wave device (1; 1*c*) according to a preferred embodiment of the present invention is provided between the first terminal (101) which is the antenna terminal and the second terminal (102) which is different from the first terminal (101). The acoustic wave device (1; 1*c*) includes the plurality of acoustic wave resonators (31 to 39). The plurality of acoustic wave resonators (31 to 39) includes the plurality of series arm resonators (31, 33, 35, 37, and 39) and the plurality of parallel arm resonators (32, 34, 36, and 38). The plurality of series arm resonators (31, 33, 35, 37, and 39) is provided on the first path (r1) connecting the first terminal (101) and the second terminal (102). The plurality of parallel arm resonators (32, 34, 36, and 38) is provided on the plurality of second paths (r21, r22, r23, and r24) that connects each of a plurality of nodes (N1, N2, N3, and N4) on the first path (r1) and the ground. When the acoustic wave resonator (31) which is electrically closest to the first terminal (101) among the plurality of acoustic wave resonators (31 to 39) is the antenna end resonator (31), the antenna end resonator (31) is the SAW resonator (3B) or the BAW resonator (3C; 3D). The at least one acoustic wave resonator (33 to 39) other than the antenna end resonator (31) among the plurality of acoustic wave resonators (31 to

39) is the first acoustic wave resonator (3A; 3Aa; 3Ab). The SAW resonator (3B) includes the piezoelectric substrate (8B), and the IDT electrode (7B) that is provided on the piezoelectric substrate (8B) and includes the plurality of electrode fingers (first electrode fingers 73B and second electrode fingers 74B). The first acoustic wave resonator (3A; 3Aa; 3Ab) includes the piezoelectric layer (6A), the IDT electrode (7A) that is provided on the piezoelectric layer (6A) and includes the plurality of electrode fingers (first electrode fingers 73A and second electrode fingers 74A), and the high acoustic velocity member (4A). The high acoustic velocity member (4A) is located on the side opposite to the IDT electrode (7A) with the piezoelectric layer (6A) provided between the high acoustic velocity layer (4A) and the IDT electrode (7A). An acoustic velocity of a bulk wave propagating through the high acoustic velocity member (4A) is higher than an acoustic velocity of an acoustic wave propagating through the piezoelectric layer (6A). The thickness of the piezoelectric layer (6A) is about 3.5λ or less when the wavelength of the acoustic wave determined by the electrode finger period of the IDT electrode (7A) is λ.

According to above described preferred embodiment of the present invention, the antenna end resonator (31) is the SAW resonator (3B) or the BAW resonator (3C; 3D), and the at least one acoustic wave resonator other than the antenna end resonator (31) is the first acoustic wave resonator (3A; 3Aa; 3Ab). Accordingly, the stopband ripple on the higher frequency side than the anti-resonant frequency is able to be significantly reduced or prevented.

In an acoustic wave device (1; 1*c*) according to a preferred embodiment of the present invention, the BAW resonator (3C; 3D) includes the first electrode (96), the piezoelectric film (97) provided on the first electrode (96), and the second electrode (98) provided on the piezoelectric film (97).

In an acoustic wave device (1; 1*c*) according to a preferred embodiment of the present invention, the stopband ripple of the antenna end resonator (31) is smaller than the stopband ripple of the first acoustic wave resonator (3A; 3Aa; 3Ab).

In an acoustic wave device (1; 1*c*) according to a preferred embodiment of the present invention, only the stopband ripple of the antenna end resonator (31) is smaller than the stopband ripple of the first acoustic wave resonator (3A; 3Aa; 3Ab).

In an acoustic wave device (1) according to a preferred embodiment of the present invention, the one series arm resonator (31) among the plurality of series arm resonators (31, 33, 35, 37, and 39) is electrically closer to the first terminal (101) than the plurality of parallel arm resonators (32, 34, 36, and 38). The one series arm resonator (31) is the antenna end resonator (31).

According to the above-described preferred embodiment of the present invention, the stopband ripple on the higher frequency side than the anti-resonant frequency is able to be significantly reduced or prevented.

In an acoustic wave device (1*c*) according to a preferred embodiment of the present invention, the one series arm resonator (31) among the plurality of series arm resonators (31, 33, 35, and 37), and the one parallel arm resonator (32) among the plurality of parallel arm resonators (32, 34, 36, and 38) are directly connected to the first terminal (101). The at least one of the one series arm resonator (31) and the one parallel arm resonator (32) is the antenna end resonator (31, 32).

According to the above-described preferred embodiment of the present invention, the stopband ripple on the higher frequency side than the anti-resonant frequency is able to be significantly reduced.

In an acoustic wave device (1; 1*c*) according to a preferred embodiment of the present invention, the at least one acoustic wave resonator (31; 32) including the antenna end resonator (31; 32) among the plurality of acoustic wave resonators (31 to 39) is the SAW resonator (3B) or the BAW resonator (3C; 3D). The acoustic wave resonator (33 to 39) other than the at least one acoustic wave resonator (31; 32) among the plurality of acoustic wave resonators (31 to 39) is the first acoustic wave resonator (3A; 3Aa; 3Ab). The SAW resonator (3B) or the BAW resonator (3C; 3D) is provided on a chip different from a chip on which the first acoustic wave resonator (3A; 3Aa; 3Ab) is provided.

According to the above-described preferred embodiment of the present invention, there is the advantage that the filter is able to be easily manufactured as compared with the case where the at least one acoustic wave resonator (31; 32) including the antenna end resonator (31; 32) and the other acoustic wave resonator (33 to 39) are integrated in one chip.

In an acoustic wave device (1; 1*c*) according to a preferred embodiment of the present invention, the high acoustic velocity member (4A) includes the high acoustic velocity film (45A) in which the acoustic velocity of the bulk wave propagating through is higher than the acoustic velocity of the acoustic wave propagating through the piezoelectric layer (6A), and the support substrate (44A) that supports the high acoustic velocity film (45A). The first acoustic wave resonator (3Ab) further includes the low acoustic velocity film (5A) provided on the high acoustic velocity film (45A).

According to the above-described preferred embodiment of the present invention, by including the at least one acoustic wave resonators (33 to 39) other than the antenna end resonator (31) as the first acoustic wave resonator (3Ab), the deterioration of the bandpass characteristic and the reflection characteristic is able to be significantly reduced or prevented.

In an acoustic wave device (1; 1*c*) according to a preferred embodiment of the present invention, the first acoustic wave resonator (3A) further includes the low acoustic velocity film (5A) provided between the high acoustic velocity member (4A) and the piezoelectric layer (6A). The acoustic velocity of the bulk wave propagating through the low acoustic velocity film (5A) is lower than the acoustic velocity of the bulk wave propagating through the piezoelectric layer (6A). The high acoustic velocity member (4A) is the high acoustic velocity support substrate (42) in which the acoustic velocity of the bulk wave propagating through is higher than the acoustic velocity of the acoustic wave propagating through the piezoelectric layer (6A).

According to the above-described preferred embodiment of the present invention, by providing the at least one acoustic wave resonators (33 to 39) other than the antenna end resonator (31) as the first acoustic wave resonator (3A), the deterioration of the bandpass characteristic and the reflection characteristic is able to be significantly reduced or prevented.

A multiplexer (100; 100*b*) according to a preferred embodiment of the present invention includes the first filter (11) including an acoustic wave device (1; 1*c*) according to a preferred embodiment of the present invention and a second filter (12). The second filter (12) is provided between the first terminal (101) and the third terminal (103) that is different from the first terminal (101). The pass band of the first filter (11) is a lower frequency band than the pass band of the second filter (12).

According to the above-described preferred embodiment of the present invention, the influence, on the second filter (12), of the stopband ripple which occurs in the first filter (11) is able to be significantly reduced or prevented.

In a multiplexer (100b) according to a preferred embodiment of the present invention, the plurality of resonator groups (30) each include the plurality of acoustic wave resonators (31 to 39). In the plurality of resonator groups (30), the first terminal (101) is the common terminal, and the second terminal (102) is the individual terminal. The antenna end resonators (31) of the plurality of resonator groups (30) are integrated in one chip.

According to the above-described preferred embodiment of the present invention, there is the advantage that the number of chips is able to be significantly reduced and thus the size is able to be significantly reduced as compared with the case where the antenna end resonators (31) are the separate chips respectively.

In a multiplexer (100) according to a preferred embodiment of the present invention, the highest frequency of the pass band of the first filter (11) is lower than the lowest frequency of the pass band of the second filter (12).

A high-frequency front end circuit (300) according to a preferred embodiment of the present invention includes a multiplexer (100) according to a preferred embodiment of the present invention, and the amplifier circuit (303) connected to the multiplexer (100).

According to the above-described preferred embodiment of the present invention, the influence of the stopband ripple which occurs in the first filter (11) on the second filter (12) is able to be significantly reduced or prevented.

A communication device (400) according to a preferred embodiment of the present invention includes a high-frequency front end circuit (300) according to a preferred embodiment of the present invention, and the signal processing circuit (the RF signal processing circuit 401 and the baseband signal processing circuit 402). The signal processing circuit processes the high-frequency signals transmitted and received by the antenna (200). The high-frequency front end circuit (300) communicates the high-frequency signals between the antenna (200) and the signal processing circuit.

According to the above-described preferred embodiment of the present invention, the influence of the stopband ripple which occurs in the first filter (11) on the second filter (12) is able to be significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device provided between a first terminal which is an antenna terminal and a second terminal which is different from the first terminal, the acoustic wave device comprising:
a plurality of acoustic wave resonators; wherein
the plurality of acoustic wave resonators include:
a plurality of series arm resonators provided on a first path electrically connecting the first terminal and the second terminal; and
a plurality of parallel arm resonators provided on a plurality of second paths electrically connecting each of a plurality of nodes on the first path and ground;
when an acoustic wave resonator electrically closest to the first terminal among the plurality of series arm resonators is a first antenna end resonator and an acoustic wave resonator electrically closest to the first terminal among the plurality of parallel arm resonators is a second antenna end resonator, each of the first and second antenna end resonators is a SAW resonator or a BAW resonator, and at least one acoustic wave resonator other than the first and second antenna end resonators among the plurality of acoustic wave resonators is a first acoustic wave resonator;
the SAW resonator includes:
a piezoelectric substrate; and
an interdigital transducer (IDT) electrode provided on the piezoelectric substrate and having a plurality of electrode fingers;
the first acoustic wave resonator includes:
a piezoelectric layer;
an IDT electrode provided on the piezoelectric layer and including a plurality of electrode fingers; and
a high acoustic velocity member which is located on a side opposite to the IDT electrode with the piezoelectric layer provided between the high acoustic velocity member and the IDT electrode and in which an acoustic velocity of a bulk wave propagating through is higher than an acoustic velocity of an acoustic wave propagating through the piezoelectric layer; and
a thickness of the piezoelectric layer is about 3.5λ or less when a wavelength of an acoustic wave determined by an electrode finger period of the IDT electrode is λ.

2. The acoustic wave device according to claim 1, wherein the BAW resonator includes:
a first electrode;
a piezoelectric film provided on the first electrode; and
a second electrode provided on the piezoelectric film.

3. The acoustic wave device according to claim 1, wherein a stopband ripple of at least one of the first and second antenna end resonators is smaller than a stopband ripple of the first acoustic wave resonator.

4. The acoustic wave device according to claim 3, wherein only the stopband ripple of the at least one of the first and second antenna end resonators is smaller than the stopband ripple of the first acoustic wave resonator.

5. The acoustic wave device according to claim 1, wherein the first antenna end resonator is electrically closer to the first terminal than the plurality of parallel arm resonators.

6. The acoustic wave device according to claim 1, wherein at least one of the first and second antenna end resonators is directly connected to the first terminal.

7. The acoustic wave device according to claim 1, wherein at least one acoustic wave resonator including the first and second antenna end resonators among the plurality of acoustic wave resonators is the SAW resonator or the BAW resonator;
an acoustic wave resonator other than the at least one acoustic wave resonator among the plurality of acoustic wave resonators is the first acoustic wave resonator; and
the SAW resonator or the BAW resonator is provided on a chip different from a chip on which the first acoustic wave resonator is provided.

8. The acoustic wave device according to claim 1, wherein the high acoustic velocity member includes:
a high acoustic velocity film in which an acoustic velocity of a bulk wave propagating through is higher than the acoustic velocity of the acoustic wave propagating through the piezoelectric layer; and
a support substrate that supports the high acoustic velocity film; and the first acoustic wave resonator further includes a low acoustic velocity film provided on the high acoustic velocity film.

9. The acoustic wave device according to claim 8, wherein a thickness of the low acoustic velocity film is about 2.0 λ or less.

10. The acoustic wave device according to claim 1, wherein
the first acoustic wave resonator further includes: a low acoustic velocity film which is provided between the high acoustic velocity member and the piezoelectric layer and in which an acoustic velocity of a bulk wave propagating through is lower than an acoustic velocity of a bulk wave propagating through the piezoelectric layer; and
the high acoustic velocity member is a high acoustic velocity support substrate in which an acoustic velocity of a bulk wave propagating through is higher than the acoustic velocity of the acoustic wave propagating through the piezoelectric layer.

11. A multiplexer comprising:
a filter including the acoustic wave device according to claim 1; and
a second filter provided between the first terminal and a third terminal that is different from the first terminal; wherein
a pass band of the first filter is a lower frequency band than a pass band of the second filter.

12. The multiplexer according to claim 11, wherein
the multiplexer includes a plurality of resonator groups each including the plurality of acoustic wave resonators;
the first terminal is a common terminal and the second terminal is an individual terminal in the plurality of resonator groups; and
the antenna end resonators of the plurality of resonator groups are integrated in one chip.

13. The multiplexer according to claim 11, wherein a highest frequency of the pass band of the first filter is lower than a lowest frequency of the pass band of the second filter.

14. A high-frequency front end circuit comprising:
the multiplexer according to claim 11; and
an amplifier circuit electrically connected to the multiplexer.

15. A communication device comprising:
the high-frequency front end circuit according to claim 14; and
a signal processing circuit that processes high-frequency signals transmitted and received by an antenna; wherein
the high-frequency front end circuit communicates the high-frequency signals between the antenna and the signal processing circuit.

16. The multiplexer according to claim 11, further comprising a third filter provided between the first terminal and a fourth terminal that is different from the first terminal.

17. The acoustic wave device according to claim 1, wherein the first acoustic wave resonator is a one-port acoustic wave resonator including a reflector provided on each side of the IDT electrode in an acoustic wave propagation direction.

18. The acoustic wave device according to claim 1, wherein the high acoustic velocity is a crystal substrate.

* * * * *